United States Patent
See et al.

(10) Patent No.: US 6,510,083 B1
(45) Date of Patent: Jan. 21, 2003

(54) ELECTRICALLY ERASABLE AND PROGRAMMABLE MEMORY THAT ALLOWS DATA UPDATE WITHOUT PRIOR ERASURE OF THE MEMORY

(75) Inventors: Deborah L. See, Placerville, CA (US); Peter K. Hazen, Auburn, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/850,644

(22) Filed: May 2, 1997

Related U.S. Application Data

(63) Continuation of application No. 08/565,645, filed on Nov. 29, 1995, now abandoned.

(51) Int. Cl.[7] .................................................. G11C 7/00
(52) U.S. Cl. ............................ 365/185.24; 365/185.03; 365/185.09; 365/185.22; 365/201
(58) Field of Search ........................ 365/185.09, 185.24, 365/200, 201, 218, 185.22, 185.03

(56) References Cited

U.S. PATENT DOCUMENTS

| | | | |
|---|---|---|---|
| 5,197,034 A | | 3/1993 | Fandrich et al. ............ 365/227 |
| 5,245,572 A | | 9/1993 | Kosonocky et al. ... 365/189.02 |
| 5,379,256 A | * | 1/1995 | Tanaka et al. ...... 365/185.24 X |
| 5,424,991 A | * | 6/1995 | Hu .................... 365/185.24 X |
| 5,434,825 A | * | 7/1995 | Harari .................. 365/185.24 |

* cited by examiner

Primary Examiner—Do Hyun Yoo
(74) Attorney, Agent, or Firm—Blakely, Sokoloff, Taylor & Zafman

(57) ABSTRACT

A processor-implemented method is described for updating a datum stored in a nonvolatile memory, bits of which cannot be overwritten from a first logical state to a second logical state without a prior erasure. A first storage location in the memory that stores a first version of the datum is accessed. A status field of the first storage location is checked to determine whether the first version of the datum has been superseded. If the status field of the first storage location indicates that the first version of the datum has not been superseded, then a most recent version of the datum is stored in a second storage location of the memory. An address of the second storage location is then written into a next location address field of the first storage location and the status field of the first storage location is written to indicate that the first version of the datum has been superseded such that the datum is updated without the prior erasure of the memory. If the status field of the first storage location indicates that the first version of the datum has been superseded, then the next location address field of the first storage location is accessed to obtain the address of a next storage location that stores a second version of the datum that supersedes the first version of the datum. The next storage location is then caused to be the first storage location and the method repeats itself to access the first storage location. An apparatus for storing a datum is also described.

18 Claims, 11 Drawing Sheets

| BLOCK0 / BLOCK1 | ERASED | RECEIVE DATA | VALID DATA | TRANSFER COMPLETE |
|---|---|---|---|---|
| ERASED | INVALID STATE. ERASE BOTH BLOCKS AND START WITH BLOCK ZERO. (CASE NO. 1) | INVALID STATE. ERASE BOTH BLOCKS AND START WITH BLOCK ZERO. (CASE NO. 2) | USE BLOCK ZERO AS VALID. ERASE BLOCK ONE. (CASE NO. 3) | INVALID STATE. ERASE BOTH BLOCKS AND START WITH BLOCK ZERO. (CASE NO. 4) |
| RECEIVE DATA | INVALID STATE. ERASE BOTH BLOCKS AND START WITH BLOCK ZERO. (CASE NO. 5) | INVALID STATE. ERASE BOTH BLOCKS AND START WITH BLOCK ZERO. (CASE NO. 6) | USE BLOCK ZERO AS VALID. ERASE BLOCK ONE. (CASE NO. 7) | USE BLOCK ONE AS VALID. ERASE BLOCK ZERO. (CASE NO. 8) |
| VALID DATA | USE BLOCK ONE AS VALID. ERASE BLOCK ZERO. (CASE NO. 9) | USE BLOCK ONE AS VALID. ERASE BLOCK ZERO. (CASE NO. 10) | INVALID STATE. ERASE BOTH BLOCKS AND START WITH BLOCK ZERO. (CASE NO. 11) | USE BLOCK ONE AS VALID DATA. ERASE BLOCK ZERO. (CASE NO. 12) |
| TRANSFER COMPLETE | INVALID STATE. ERASE BOTH BLOCKS AND START WITH BLOCK ZERO. (CASE NO. 13) | USE BLOCK ZERO AS VALID. ERASE BLOCK ONE. (CASE NO. 14) | USE BLOCK ZERO AS VALID. ERASE BLOCK ONE. (CASE NO. 15) | INVALID STATE. ERASE BOTH BLOCKS AND START WITH BLOCK ZERO. (CASE NO. 16) |

*Figure 8*

ELECTRICALLY ERASABLE AND PROGRAMMABLE MEMORY THAT ALLOWS DATA UPDATE WITHOUT PRIOR ERASURE OF THE MEMORY

This is a continuation of application Ser. No. 08/565,645, filed Nov. 29, 1995, now abandoned.

FIELD OF THE INVENTION

The present invention pertains to the field of memories. More particularly, this invention relates to an apparatus and a method for allowing data update in an electrically erasable and programmable memory without prior erasure of the memory.

BACKGROUND OF THE INVENTION

One type of prior art nonvolatile memory is a flash Erasable and electrically Programmable Read-Only Memory ("flash EPROM"). A typical flash EPROM has the same array configuration as a standard Electrically Programmable Read-Only Memory ("EPROM") and can be programmed in similar fashion as EPROM. Once programmed, the entire contents of the flash EPROM can be erased by electrical erasure in one relatively rapid operation. A high erasing voltage is made available to the sources of all the cells in the flash EPROM or in one block of the flash EPROM simultaneously. This results in a full array erasure or block erasure. The flash EPROM or the erased block of the flash EPROM may then be reprogrammed with new data.

Flash EPROMs differ from conventional Electrically Erasable Programmable Read Only Memory ("EEPROMs") with respect to erasure. Conventional EEPROMs typically use a select transistor for individual cell erasure control. Flash EPROMs, on the other hand, typically achieve much higher density with single transistor cells. As described above, during the erasure of the flash EPROM, a high voltage is supplied to the sources of all memory cells in a memory array or a block of the memory array simultaneously. This results in a full array erasure or block erasure.

For a prior art single bit flash EPROM, a logical "one" means that few, if any, electrons are stored on a floating gate associated with a bit cell. A logical "zero" means that many electrons are stored on the floating gate associated with the bit cell. Erasure of the flash EPROM causes a logical one to be stored in each bit cell. Each single bit cell of the flash EPROM cannot be overwritten from a logical zero to a logical one without a prior erasure. Each single bit cell of that flash EPROM can, however, be written from a logical one to a logical zero, given that this entails simply adding electrons to a floating gate that contains the intrinsic number of electrons associated with the erased state.

One disadvantage of the flash EPROM, however, is that each single bit cell cannot be overwritten from the logical zero to the logical one without a prior erasure. Another disadvantage of the flash EPROM is that it must be erased—i.e., reset to the logical one state—in large blocks or in a manner that erases the entire device.

Another disadvantage of the flash EPROM is that there is a finite limit on the number of erase and write cycles for the flash EPROM before the flash EPROM will fail.

The limitations with respect to overwriting and erasure associated with the flash EPROMs have, in certain instances, limited the usefulness of the flash EPROMs.

SUMMARY AND OBJECTS OF THE INVENTION

One of the features of the present invention is to allow an electrically erasable and programmable memory to emulate a random access memory (RAM).

Another feature of the present invention is to provide an arrangement that allows a block-erasable nonvolatile memory to have byte alterability feature.

A further feature of the present invention is to provide apparatus and a method for updating data stored in an electrically erasable and programmable nonvolatile memory without a prior erasure of the memory.

Described hereinafter is a processor-implemented method for updating a datum stored in a nonvolatile memory, bits of which cannot be overwritten from a first logical state to a second logical state without a prior erasure of the memory. The method includes the step of accessing a first storage location in the memory that stores a first version of the datum. A status field of the first storage location is checked to determine whether the first version of the datum has been superseded. If the status field of the first storage location indicates that the first version of the datum has not been superseded, then a most recent version of the datum is stored in a second storage location of the memory. An address of the second storage location is written into a next location address field of the first storage location. The status field of the first storage location is then written to indicate that the first version of the datum has been superseded such that the datum is updated without the prior erasure of the memory.

An apparatus for storing a datum is also described that includes a processor and a nonvolatile memory having a first and a second processor-allocated storage location, each including memory cells that cannot be overwritten from a first logical state to a second logical state without a prior erasure of the memory. The first processor-allocated storage location further includes a data field that stores a version of the datum, a status field indicating whether the version of the datum stored in the data field has been superseded by an updated version of the datum stored in the second storage location of the memory, and a next pointer field that stores an address of the second processor-allocated storage location that stores the updated version of the datum such that the datum is updated in the memory without the prior erasure of the memory.

BRIEF DESCRIPTION OF THE DRAWINGS

The present invention is illustrated by way of example and not by way of limitation in the figures of the accompanying drawings, in which like references indicate similar elements and in which:

FIG. 8 is a table that lists a combination of block status of two blocks during initialization.

DETAILED DESCRIPTION

Figure 1:
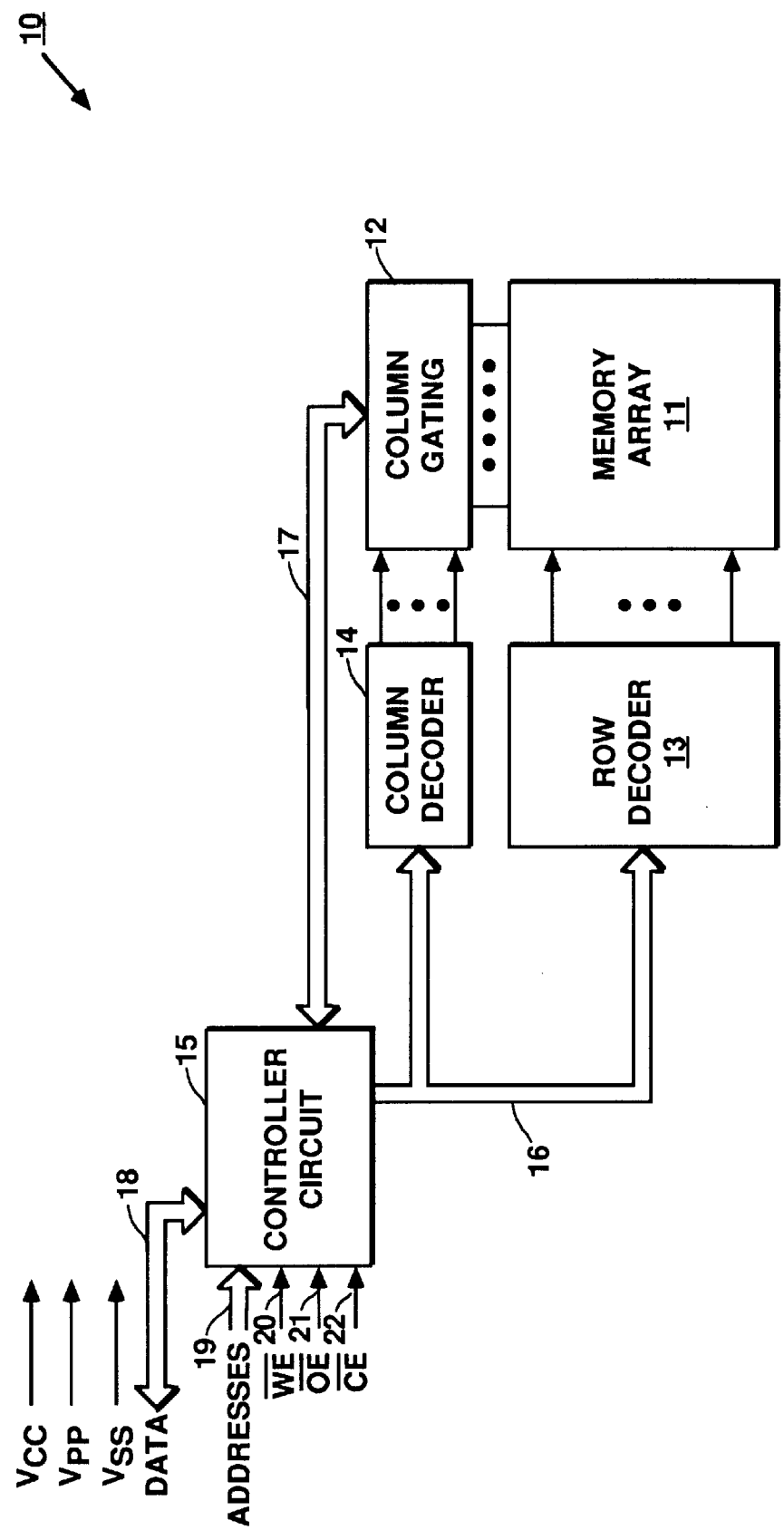
FIG. 1 shows a block diagram of a flash EPROM.

FIG. 1 is a block diagram of a flash EPROM 10. Flash EPROM 10 implements a data storage and update structure that allows data to be updated without prior erasing the memory in accordance with one embodiment of the present invention.

Flash EPROM 10 can be used in any kind of computer systems or data processing systems. The computer system can be a personal computer, an embedded engine control system used in a machine or automobile, a notebook, a laptop, a personal assistant, a minicomputer, a workstation, a mainframe, a multiprocessor computer, or any other type of computer system. In addition, the system in which flash EPROM 10 is used can be a printer, a cellular phone, a modem, a digital answering system, or any other data storage system.

Flash EPROM 10 includes a memory array 11 and row and column decoders 13 and 14 coupled to memory array 11. Column decoder 14 is coupled to memory array 11 via a column gating circuit 12.

Flash EPROM 10 also includes a memory controller circuit 15. Controller circuit 15 controls the memory operations of flash EPROM 10. The memory operations of flash EPROM 10 include read, programming, and erasure operations. Controller circuit 15 receives addresses from external circuitry (not shown) via address pins 19. Controller circuit 15 also receives the data to be written to memory array 11 from the external circuitry and sends the data read from memory array 11 to the external circuitry via data pins 18. Data pins 18 also supply the device operation commands to controller circuit 15. Controller circuit 15 can be implemented by any known flash EPROM memory control circuit.

Controller circuit 15 receives four control signals via their respective pins. These control signals are a chip enable control signal $\overline{CE}$, an output enable control signal $\overline{OE}$, and a write enable control signal $\overline{WE}$. These control signals are also known in the art and will not be described in more detail below.

The $V_{PP}$ pin receives the program/erase power supply voltage $V_{PP}$ for flash EPROM 10. The $V_{CC}$ pin receives the device power supply voltage for flash EPROM 10 and $V_{SS}$ is ground.

Memory array 11 includes a number of blocks (not shown in FIG. 1), each can be electrically erased. In one embodiment, the blocks of memory array 11 are organized as bit line blocks. This is done by arranging bit lines of memory array 11 into groups. In another embodiment, the blocks of memory array 11 are organized as word line blocks. This is done by arranging word lines of memory array 11 into groups.

Each block of memory array 11 includes a number of floating gate memory cells, each of which can be electrically programmed from a logical "one" state to a logical "zero" state. Each of the memory cells, however, cannot be electrically programmed from the logical zero state to the logical one state. The memory cells of memory array 11 or of one block of memory array 11 can be electrically erased from the logical zero state to the logical one state. In other words, each of the memory cells in memory array 11 or a block of the memory array cannot be overwritten from the logical zero state to the logical one state without a prior erasure operation of the entire memory array 11 or the block.

Figure 2:
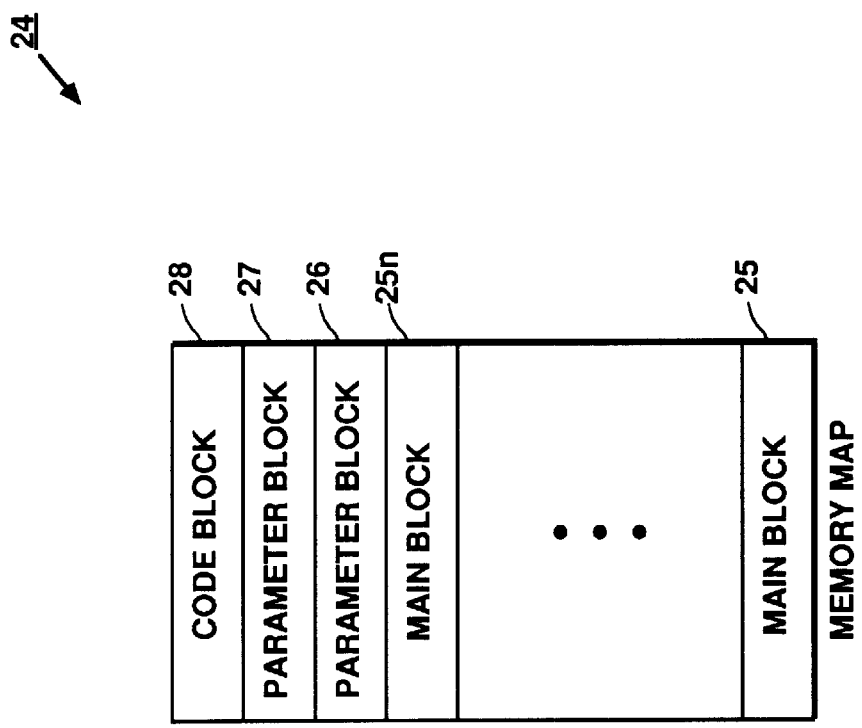
FIG. 2 shows the memory map of the memory array of the flash EPROM of FIG. 1.

FIG. 2 shows a memory map 24 of memory array 11 of flash EPROM 10 of FIG. 1. As can be seen from FIG. 2, memory map 24 shows that memory array 11 includes a code block 28, two parameter blocks 26 and 27 and a number of main blocks 25 through 25n. Code block 28 typically stores program codes that require the least updating. Parameter blocks 26 and 27 typically store frequently updated parameters. Main blocks 25–25n store other program codes or data.

FIG. 2 shows one embodiment of arranging memory array 11 into blocks. Alternatively, memory array 11 may include more or fewer than two parameter blocks and more than one code block, but the number of parameter blocks in memory array 11 need to be symmetrical (i.e., paired).

The codes stored in code block 28 include a flash EPROM updating application program that, in combination with structures in parameter blocks 26 and 27, implements one embodiment of the present invention. The updating application program updates parameters stored in parameter blocks 26 and 27 without prior erasing blocks 26 and 27. The updating application program is executed by an external processor 61 (see FIG. 3A) when flash EPROM 10 is connected to processor 61 to form a data storage and management system 60.

Figure 3A:
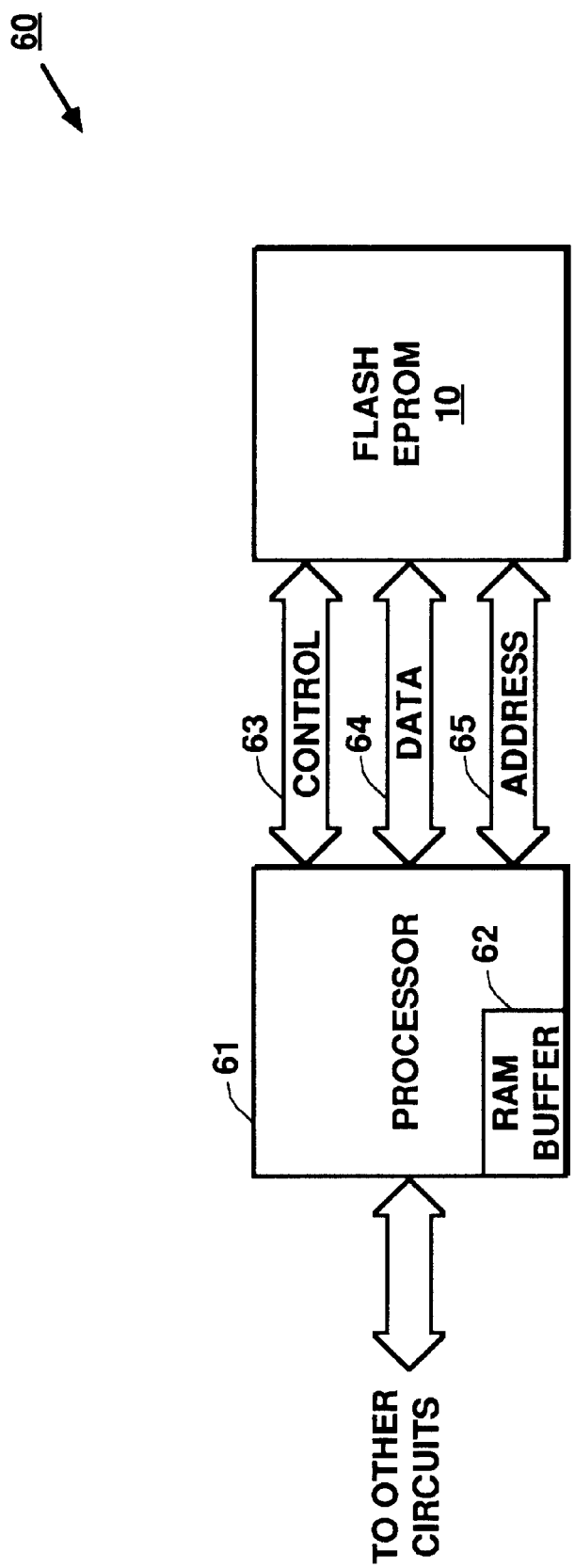
FIG. 3A shows a data storage system having the flash EPROM of FIGS. 1 and 2 and a processor for executing an application program to read and write data to and from the flash EPROM in accordance with one embodiment of the present invention.

As can be seen from FIG. 3A, processor 61 is connected to flash EPROM 10 via buses 63 through 65. Processor 61 includes a RAM buffer 62. Alternatively, RAM buffer 62 can be an individual RAM chip connected to but separated from processor 61. Processor 61 is also connected to other circuits (not shown). This means that data storage and management system 60 can be part of a control or processing system (not shown).

Processor 61 can be any known processor or microcontroller. In one embodiment, processor 61 is a general purpose processor. In another embodiment, processor 61 is a memory controller. In one embodiment, processor 61 and flash EPROM 10 reside on a single semiconductor substrate. In another embodiment, processor 61 does not reside on the same semiconductor substrate as flash EPROM 10.

Before processor 61 starts to read or write parameters from or to flash EPROM 10, processor 61 loads the updating application program from code block 28 (see FIG. 2) of flash EPROM 10 into RAM buffer 62 through the read operation of flash EPROM 10. Processor 61 then executes the updating application program from RAM buffer 62 to read from and/or write to flash EPROM 10. The updating application program is described in more detail below, also in conjunction with FIGS. 4 through 8.

Figure 3B:
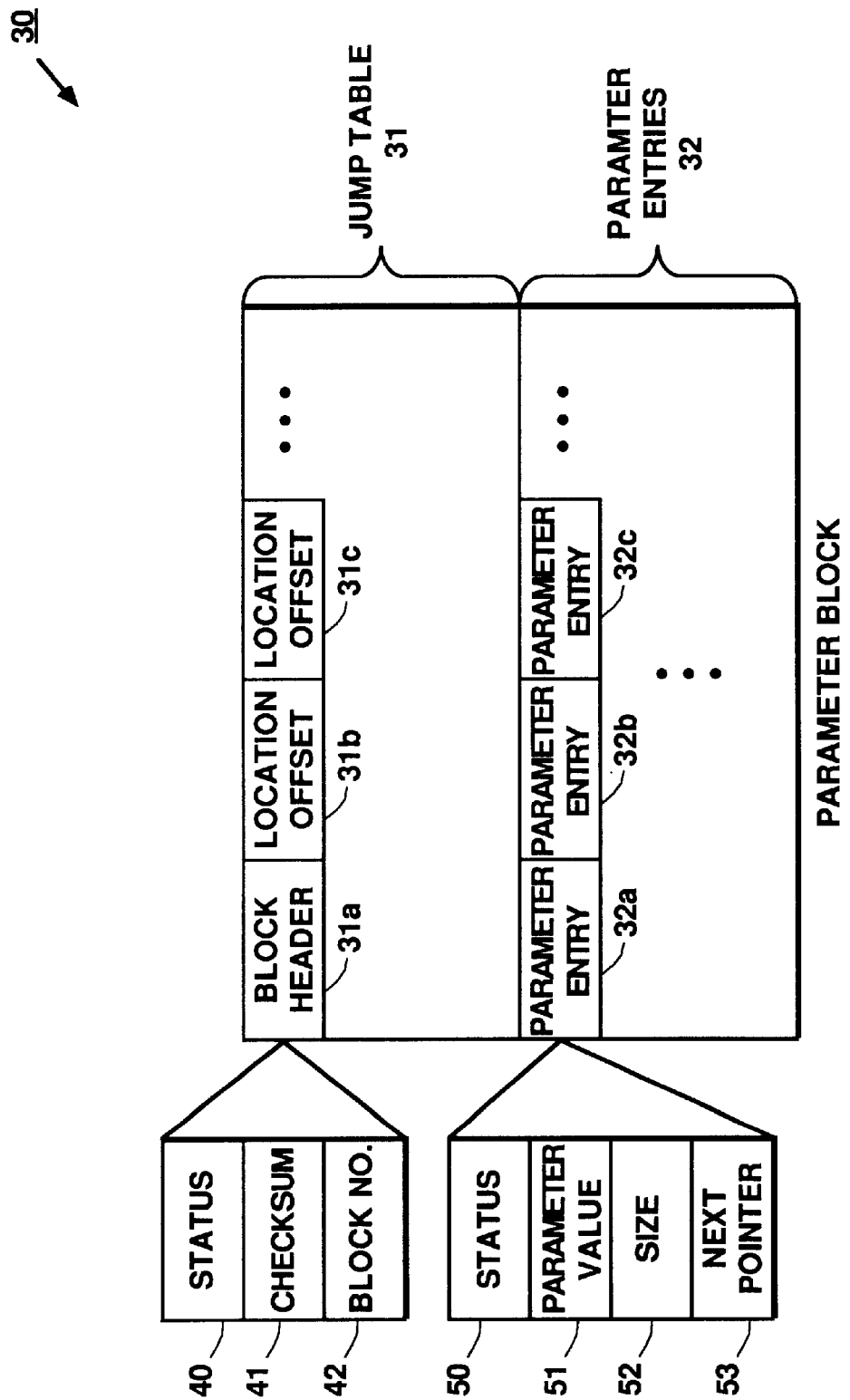
FIG. 3B shows the data structure of a block of the memory array of the flash EPROM of FIGS. 1 and 2 in accordance with one embodiment of the present invention.

Referring back to FIG. 2, in order for the updating application program to update parameters stored in parameter blocks 26 and 27 without a prior erasure of each of the blocks, each of parameter blocks 26 and 27 is structured to include a block header, a first instance jump table, and a parameter entry structure in accordance with one embodiment of the present invention. These structures in each of parameter blocks 26 and 27 help the updating application program to update parameters stored in blocks 26 and 27 without a prior erasure of the blocks. FIG. 3B shows the structures within a parameter block 30, which will be described in more detail below. Parameter block 30 can be either parameter block 26 or 27 of FIG. 2.

Referring to FIG. 3B, parameter block 30 includes a jump table section 31 and parameter entry section 32 located adjacent to jump table section 31. Jump table 31 includes a block header 31*a* and a number of location offset entries, each having one word length. Block header 31*a* stores information regarding the block. Each of the location offset entries in jump table 31 stores an offset address of a parameter entry that stores the first instance of a parameter in parameter entry section 32. The offset address indicates the offset position of that parameter entry from a start address of parameter entry section 32 of block 30. As can be seen from FIG. 3B, the start address points at parameter entry 32*a*. FIG. 3B only shows two location offset entries 31*b* and 31*c*.

FIG. 3B also shows the structure of block header 31*a*. As can be seen from FIG. 3B, block header 31 a includes a status field 40, a checksum field 41 and a block number field 42. In one embodiment, status field 40 is one byte long. Each of checksum field 41 and block number field 42 is half byte long. Status field 40 is used to indicate the status of block 30. Because status field 40 includes eight bits that can be individually written from the logical one state to the logical zero state, status field 40 can be written eight times to indicate eight different block status of block 30. A table is shown below that lists different status values of status field 40 and their corresponding status definitions.

TABLE I

| STATUS VALUE | DEFINITION |
| --- | --- |
| 1111 1111 (FF) | Block is an erased block |
| 0111 1111 (7F) | Block is receiving data |
| 0011 1111 (3F) | Block is a valid block |
| 0001 1111 (1F) | Transfer is complete. Block can no longer hold valid data |
| 0000 1111 through 0000 0000 | Reserved for future use |

Initially (i.e., after block 30 has been erased), status field 40 stores the "FF" value (i.e., all the bits of status field 40 are at logical one level). Then the user can write to status field 40 by individually programming one bit at a time without erasing status field 40. As can be seen from the above Table, when the user changes the status value of status field 40 from "FF" to "7F", block 30 is indicated as receiving data from another parameter block during a block transfer operation or from the external circuit. When the value of status field 40 is changed to "3F" from "7F", it indicates that block 30 currently holds valid data. This status value will not change until the storage space of the block is filled up and all valid parameters are transferred to another block, at which time the value is changed to "1F" from "3F". By this arrangement, the status value stored in status field 40 can be changed without prior erasing the block.

Alternatively, status field 40 is only written once from the "FF" value to the "3F" value to indicate block 30 stores data (i.e., is a valid block). In this case, status field 40 either indicates that block 30 is an erased block (i.e., stores the "FF" value) or a valid block (i.e., stores the "3F" value). This technique is used to ensure that recovery is possible by knowing the latest operation of the block in the event of power loss.

Block number field 42 stores the sequential number of parameter block 30 within the parameter blocks of flash EPROM 10. As described above in connection with FIG. 2, flash EPROM 10 includes two parameter blocks 26 and 27. Therefore, the sequential number stored in field 42 indicates whether the block is a first parameter block or a second parameter block. This allows the updating application program to access the parameter blocks 26 and 27 in order in accordance with their sequential numbers. When used with the value stored in checksum field 41, the sequential number stored in block number field 42 also enables the system to determine the validity of status field 40 of the block. Checksum field 41 stores the complement value of the sequential number stored in block number field 42. When the value stored in field 41 is exclusive ORed with the value stored in field 42 to be equal to a predetermined value (i.e., FF), it indicates that block 30 is a valid block. If not, it indicates that block 30 does not contain valid data even if the status value stored in status field 40 indicates otherwise. This also allows data corruption of block 30 by removal of system power during the erasure operation of block 30 to be detected. Block 30 is a corrupted block when power supply is removed from flash EPROM 10 during erasure of block 30.

Jump table 31 includes an array of entries the number of which depends on the number of parameters the user can store in block 30. In one embodiment, jump table 31 includes 256 entries. This means that parameter entry section 32 of block 30 can store 256 parameters though it can store several instances of each parameter until all storage space in this section of the block is used up. If the value of an offset entry is "FF" (i.e., all the bits of the entry are logically high), that entry has not yet been written and the corresponding parameter has not yet been stored in parameter block 30. If the value of a location offset entry is not equal to "FF", then the entry has been written and the value stored indicates the offset location into parameter entry section 32 of the block at which the first instance (or version) of the parameter is stored. Updates of that parameter can then be conducted in block 30 through the parameter entry structure and the updating application program (both will be described in more detail below) without the prior erasure of block 30 before the updates.

Alternatively, block 30 does not have location offset entries in jump table 31. In this case, only block header 31*a* and parameter entries 32 exist in parameter block 30. When this occurs, the user can access the parameter entry that stores the first instance of a parameter using the physical address of that parameter. The physical address of a parameter always points to the parameter entry that stores the first instance of the parameter.

Because memory cells of flash EPROM 10 cannot be overwritten from the logical zero state to the logical one state without a prior erasure of the memory, each of the parameter entries in parameter entry section 32 of block 30 cannot store an updated version of a parameter once that parameter entry has been written with a prior version (or instance) of the parameter. An erasure operation is required for block 30 before that parameter entry is capable of storing the updated version of the parameter.

Figure 3C:
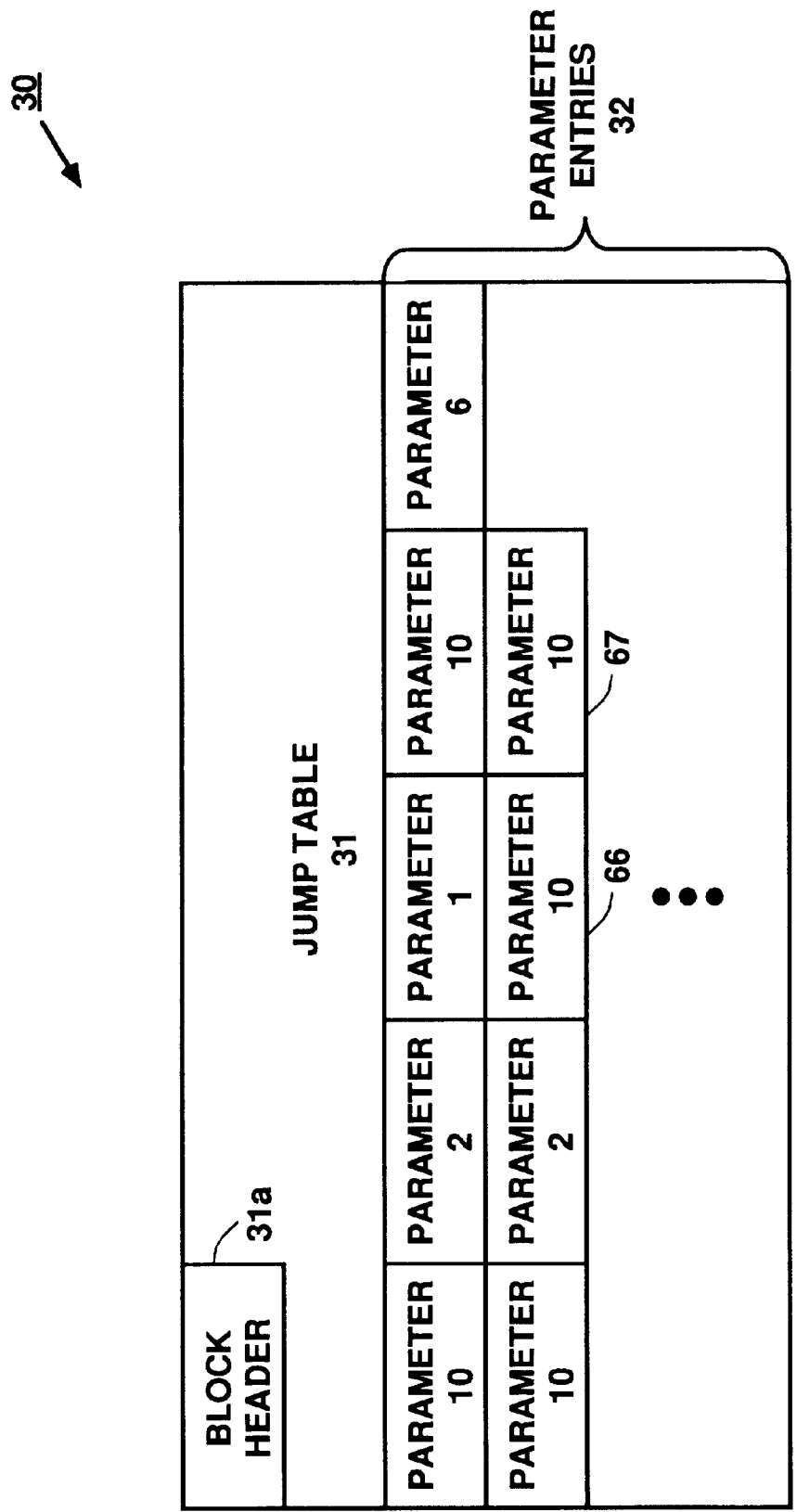
FIG. 3C shows how parameters are updated and stored in a block of the flash EPROM that has the data structure of FIG. 3B.

In order for a parameter stored in block 30 to be updated without prior erasing the block, a new parameter entry is required to store the updated version of the parameter. The new parameter entry storing the updated version is also required to link to the parameter entry that stores the to-be-superseded version of the parameter. In doing so, a linked list of parameter entries can be established for the parameter throughout updates of the parameter (see FIG. 3C). For example, as can be seen from FIG. 3C, when the version of parameter 10 stored in parameter entry 66 is to be superseded by a newer version of the parameter, the newer version of parameter 10 is stored in parameter entry 67 which is the next available parameter entry in parameter entry section 32.

In addition, parameter entry 66 is then marked to indicate that particular version of the parameter has been superseded by the newer version stored in parameter entry 67. This therefore causes each of the parameter entries in parameter entry section 32 to have certain structure. FIG. 3B shows the structure of each of the parameter entries in parameter entry section 32.

As can be seen from FIG. 3B, each parameter entry includes a status field (i.e., status field 50), a parameter value field (i.e., parameter value field 51), and a next pointer address field (i.e., field 53). In addition, each parameter entry may also include a field storing data regarding the size of the parameter entry (i.e., size field 52). The size field 52 is typically required when each parameter entry has a variable size. When each parameter entry in parameter block 30 has the same size, the size field 52 is not needed in each parameter entry.

In one embodiment, status field 50 is one byte long and each of parameter value field 51 and next pointer address field 52 is one word (i.e., two bytes) long. Alternatively, when each of parameter entries is of variable size, the length of parameter value field 51 may vary while other fields of the parameter entry remain fixed.

Status field 50 of each parameter entry stores the status value that indicates status of the parameter entry. A table is shown below that lists different status values of status field 50 and their corresponding definitions.

TABLE II

| STATUS VALUE | DEFINITION |
| --- | --- |
| 1111 1111 (FF) | Erased |
| 0111 1111 (7F) | Valid |
| 0011 1111 (3F) | Updating |
| 0001 1111 (1F) | Superseded |
| 0000 1111 through 0000 0000 | Reserved for future use |

As can be seen from Table II above, when the status field of a parameter entry stores the "FF" value, it indicates that the parameter entry is an erased entry and has not been used to store a parameter. When the parameter entry is used to store a parameter, its status field is then written with the "7F" value. This is accomplished by programming the most significant bit of the status field to logical zero. When the parameter value stored in the parameter entry is to be updated with a newer version of the parameter, the status field of that parameter entry is again written with the value "3F" to indicate that the parameter value stored in the corresponding parameter value field is being updated. This write operation of the status field is accomplished by programming the second most significant bit of the status field to logical zero. When the newer version of the parameter has been stored in an unused parameter entry, the status field of this parameter entry is then written with the "1F" value to indicate that the parameter value stored in this parameter entry has been superseded. Again, this write is accomplished by programming the next most significant bit of the status field to logical zero.

The next pointer address field (i.e., field 53) of a parameter entry stores the address of the next parameter entry (or instance) that stores the newer version of the parameter. When the status field of a parameter entry is changed to the superseded status value, the next pointer address field of that parameter entry stores the address of the next parameter entry that stores the updated version of the parameter. For example and as can be seen from FIG. 3C, when the version of parameter 10 stored in parameter entry 67 updates the version of the parameter stored in parameter entry 66, the next pointer address field (not shown in FIG. 3O) of parameter entry 66 stores the address of parameter entry 67. Parameter entry 67 retains a default condition (i.e., FF value) in its next pointer address field, indicating that this entry stores the most recent version of the parameter. In doing so, the parameter entries that store different versions of the same parameter can be linked together such that the parameter entry that stores the most recent version of the parameter can be found through the link and the parameter can be updated usually at any time without prior erasing the block.

As described above, FIGS. 4 through 8 show various processes of the updating application program for updating parameters in the parameter blocks of flash EPROM 10 having structures described above in connection with FIGS. 2 and 3B–3C. As described above, the updating application program and the structures described above for the parameter blocks implement one embodiment of the present invention.

Figure 4:
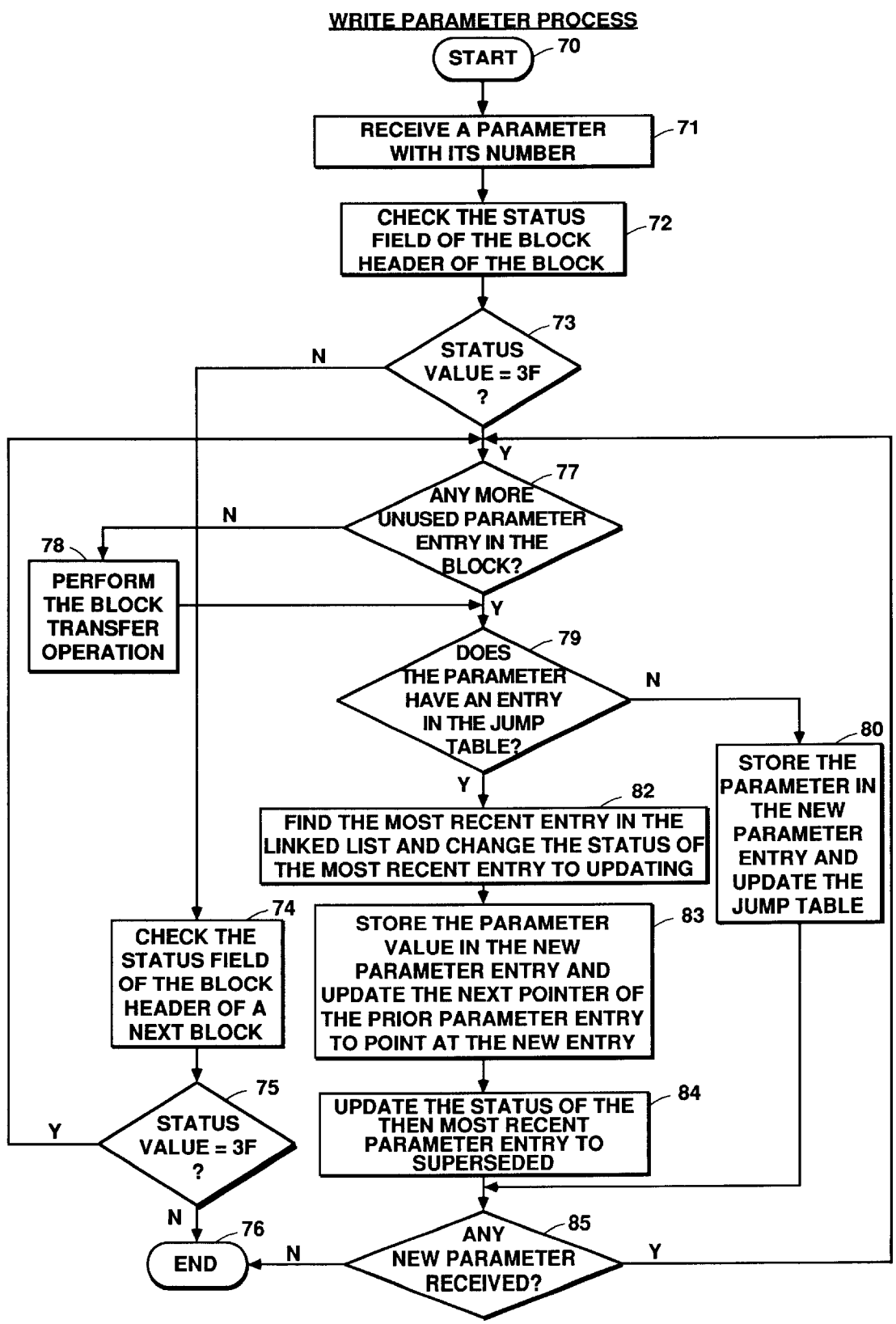
FIG. 4 shows a flow chart of a write process of the application program in accordance with one embodiment of the present invention.

Referring now to FIG. 4, the write process of the updating application program starts at step 70. FIG. 4 shows how the updating application program updates a parameter stored in a parameter entry of a block of flash EPROM 10.

At step 71, a parameter is received with its parameter number. Each parameter has its own parameter number and the parameter number of a parameter distinguishes the parameter from other parameters. At step 72, the status field of the block header of a block is checked. As described above, flash EPROM 10 includes two parameter blocks. Therefore, the updating application program needs to be set to check the block header of one of the two blocks first. Here, the updating application program is set to check the block with the lowest block number first. Alternatively, the updating application program can be set to check the status field of the parameter block with the highest block number first.

At step 73, it is determined if the value obtained from the status field of the block header of the block is equal to the "3F" value (i.e., whether the block is valid). If so, the process goes to step 77. If not, the process proceeds to step 74 to find a next available block.

At step 74, the status field of the block header of the next block is checked. At step 75, the value obtained from the status field of the next block is determined to find out if it is equal to "3F". If so, the process proceeds to step 77. If not, the process ends at step 76.

Figure 6:
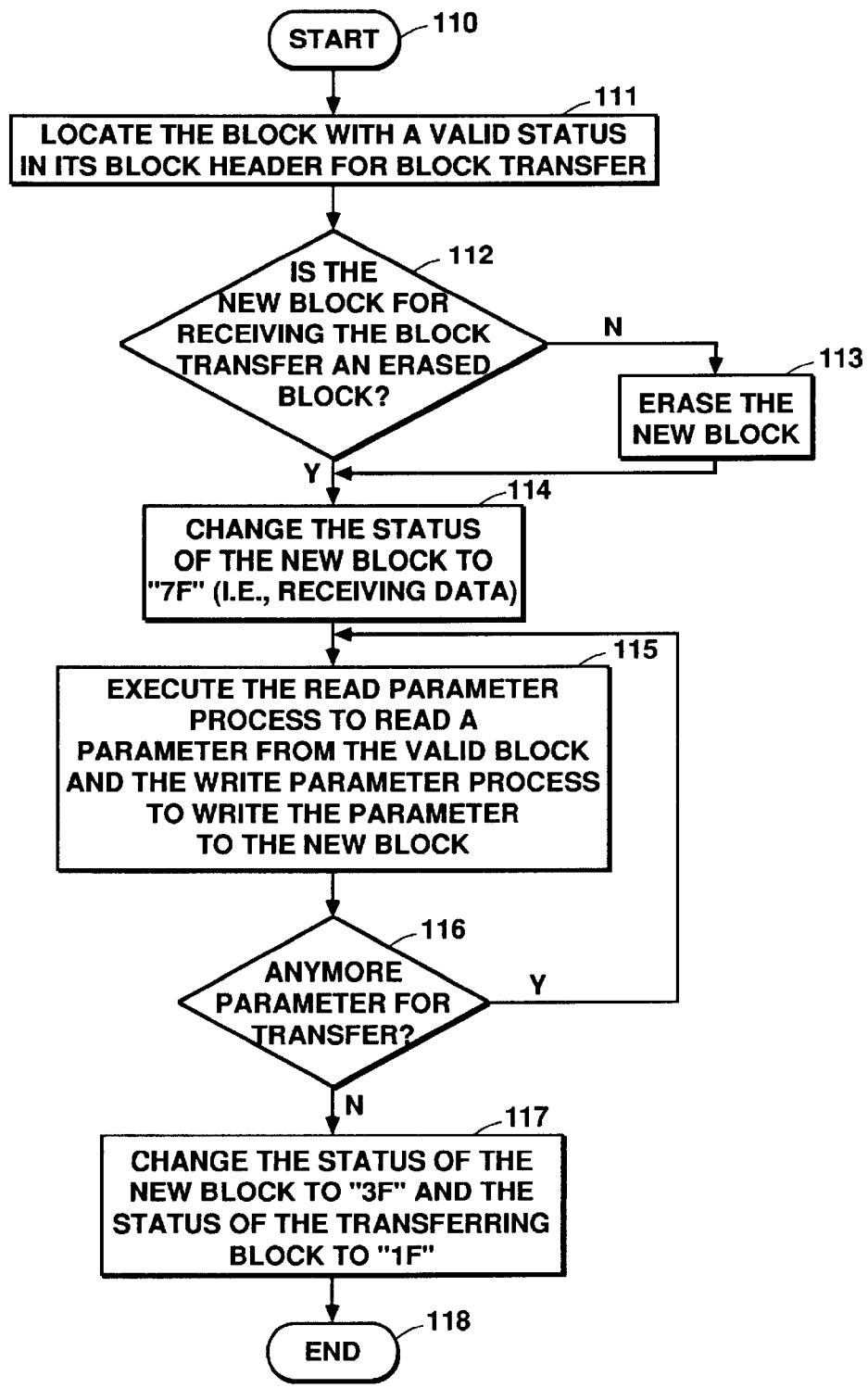
FIG. 6 shows in flow chart diagram form a block transfer process of the application program in accordance with one embodiment of the present invention.

At step 77, it is determined if there is any unused parameter entry (i.e., erased parameter entry) in the block. If the answer is no, then step 78 is performed at which the block transfer operation is performed to transfer the most recent version of each of the parameters to the other block. FIG. 6 shows the process of the block transfer operation, which will be described in more detail below. The process then goes to step 79.

If, at step 77, it is determined that there is at least one unused parameter entry in the block, then step 79 is performed. At step 79, it is determined if the parameter has a location offset entry in the jump table. If the answer is no (i.e., the parameter has not been stored in the block before an this is the first instance of the parameter to be stored in the block), then step 80 is performed to store the parameter in the allocated unused parameter entry. In addition, the offset address of that parameter entry is then stored in an offset entry of the jump table at step 80. In doing so, the jump table contains the address pointing to the parameter entry that stores the first instance of the parameter. The process then goes to step 85.

If, at step 79, it is determined that the parameter has an entry in the jump table, then step 82 is performed at which the parameter entry that stores the most recent version of the parameter is first located through the offset address stored in the offset entry of the jump table. This is done by obtaining the offset address stored in the offset entry to locate the parameter entry that stores the first instance of the parameter. Then the next pointer address field of that parameter entry is accessed to obtain the address of the parameter entry that stores the next version of the parameter. The process is repeated until the parameter entry that stores the most recent version of the parameter is located. Then the status of that parameter entry (i.e., the one that stores the most recent version of the parameter) is changed to indicate that the parameter is being updated (i.e., "3F"). The newer value of the parameter is then stored in the allocated unused parameter entry at step 83. Meanwhile, the next pointer field of the parameter entry that stores the then most recent version of parameter prior to the newer value is written to store the address of the parameter entry that stores the newer value of the parameter. This ensures that the latest version of the parameter stored can be accessed through the next pointer link. In addition, this ensures updates of the parameter without prior erasing the memory. At step 84, the status field of the parameter entry that stores the then most recent version of the parameter prior to the newer value is written with the "1F" value to indicate that the parameter value stored in that parameter entry has been superseded by the newer value. The process then proceeds to step 85, at which it is determined if any newer parameter value is to be stored in the block. If so, the process returns to step 77. If not, the process ends at step 76.

Figure 5:
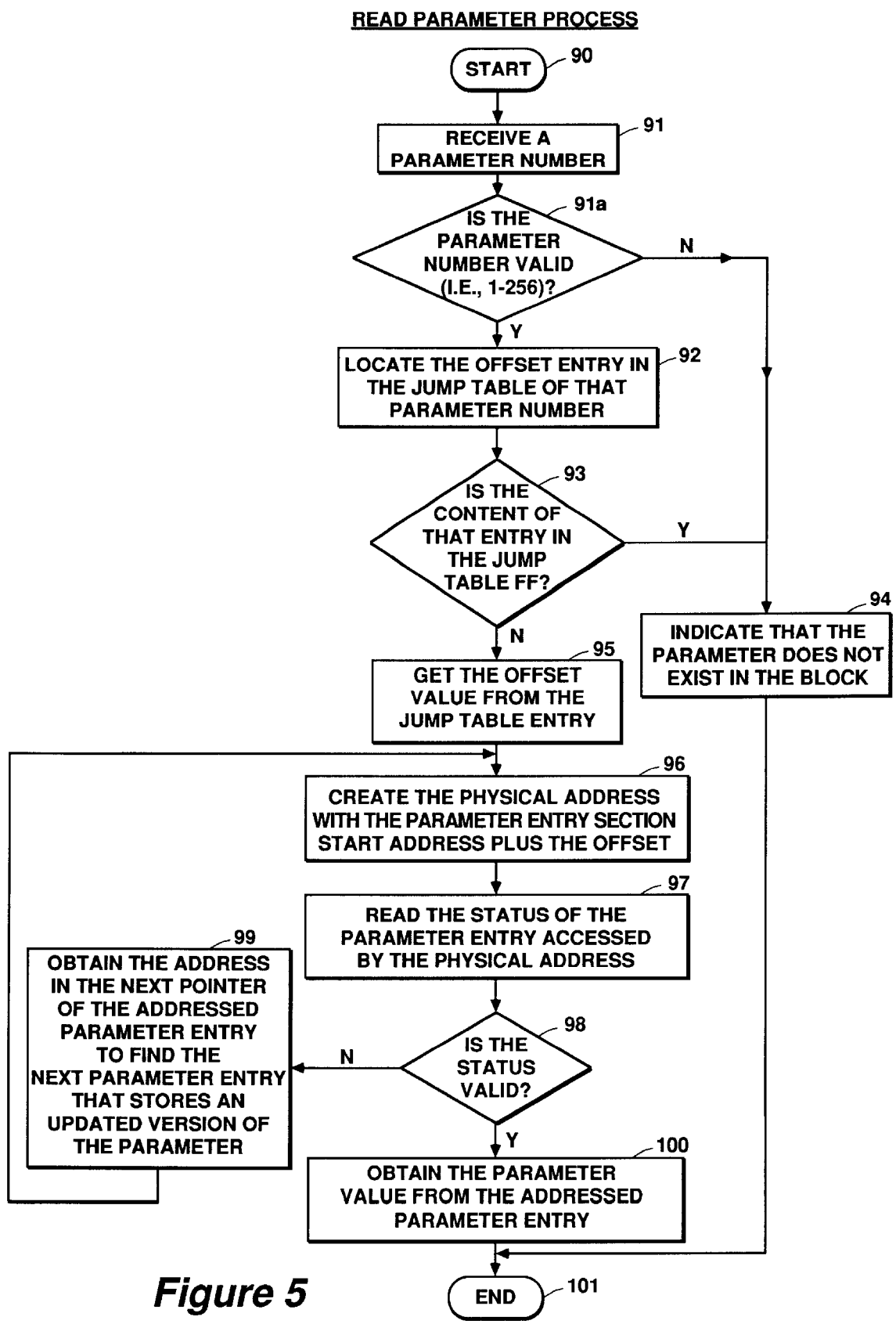
FIG. 5 shows in flow chart diagram form a read process of the application program in accordance with one embodiment of the present invention.

FIG. 5 shows the process of reading a parameter from the parameter blocks by the updating application program. As can be seen from FIG. 5, the process starts at step 90. At step 91, a parameter number is received. At step 91a, the parameter number is checked to see if it is a valid parameter number. At step 92, the offset entry in the jump table for that parameter number is located. At step 93, it is determined if the value stored in that offset entry is "FF". If the answer is yes, it means that the parameter has never been stored in the block and the process ends at step 101 through step 94. If the answer is no, then the process moves to step 95 at which the offset value in the offset entry is obtained. Then the physical address of the parameter entry that stores the first instance of the parameter is obtained at step 96 by combining the offset value with the start address of the parameter entry section of the block. The parameter entry is accessed by the physical address and the status field of the addressed parameter entry is checked to determine if the parameter value stored in that parameter entry is valid at steps 97 and 98. If, at step 98, it is determined that the status is not valid, then step 99 is performed at which the next pointer field of the addressed parameter entry is accessed to obtain the offset address for the next parameter entry that stores an updated version of the parameter. The process then returns to step 96.

If, at step 98, it is determined that the status of the parameter entry is valid, then step 100 is performed to access the parameter value field of that parameter entry for the most recent parameter value of that parameter. The process then ends at step 101.

FIG. 6 shows the process of the block transfer operation performed by the updating application program. As can be seen from FIG. 6, the process starts at step 110. At step 111, the block having a valid status in its block header is located for the block transfer. At step 112, it is determined whether the new block (i.e., receiving block) is an erased block. If not, the block undergoes the erasure operation at step 113. At step 114, the new block that is receiving data has its status changed to "7F" (i.e., receiving data). At step 115, the updating application program executes the read parameter process shown in FIG. 5 to read a first parameter from the valid block and executes the write parameter process shown in FIG. 4 to write that parameter into the new block. Then step 116 is performed to determine if there are more parameters for transfer. If so, step 115 is repeated. If not, the process goes to step 117 at which the status of the new block is changed to valid (i.e., "3F") and the status of the transferring block is changed to transfer complete (i.e., "1F"). The process then ends at step 118.

Figure 7A:
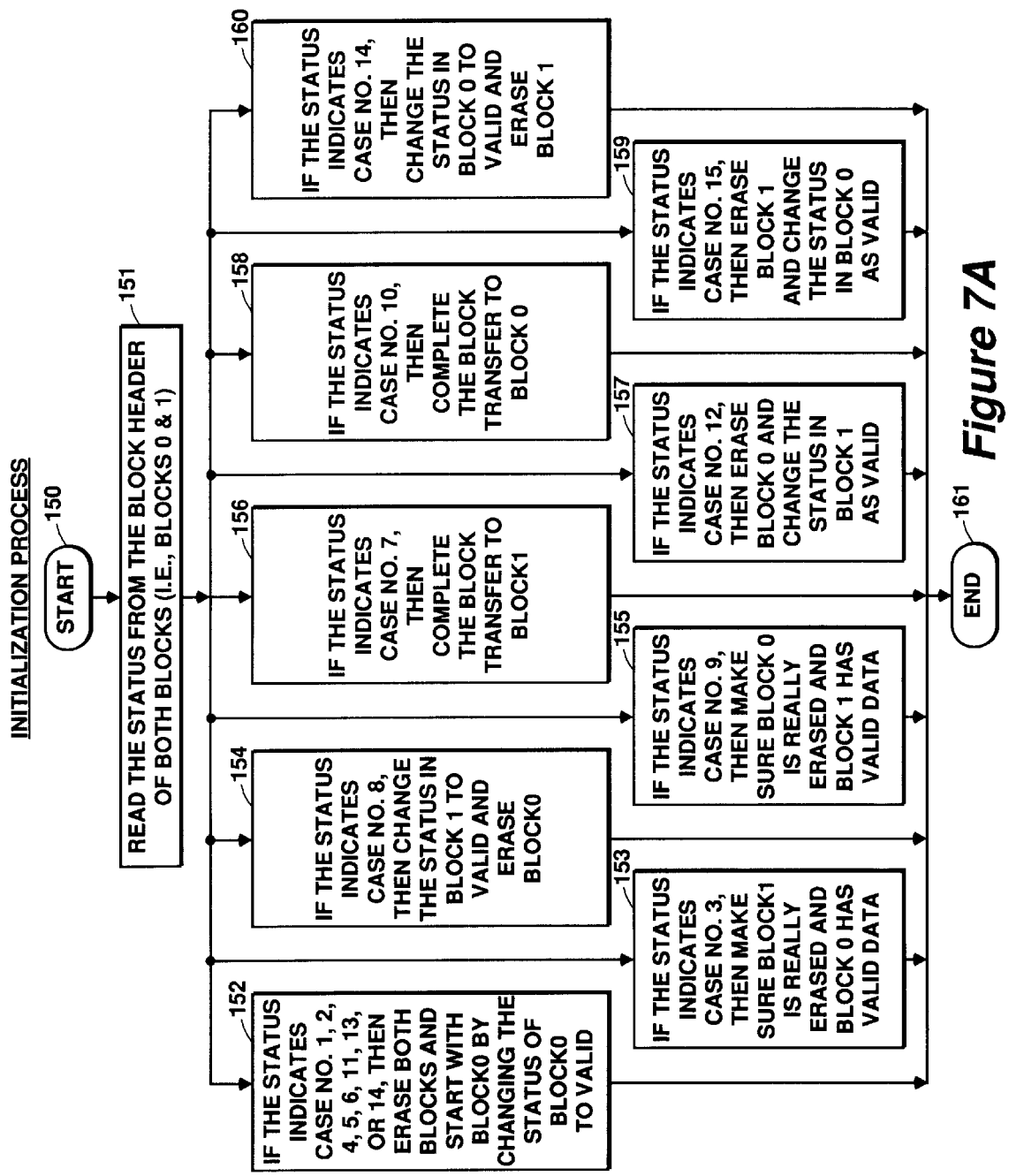
FIGS. 7A and 7B show an initialization process of the application program in accordance with one embodiment of the present invention.
Figure 7B:
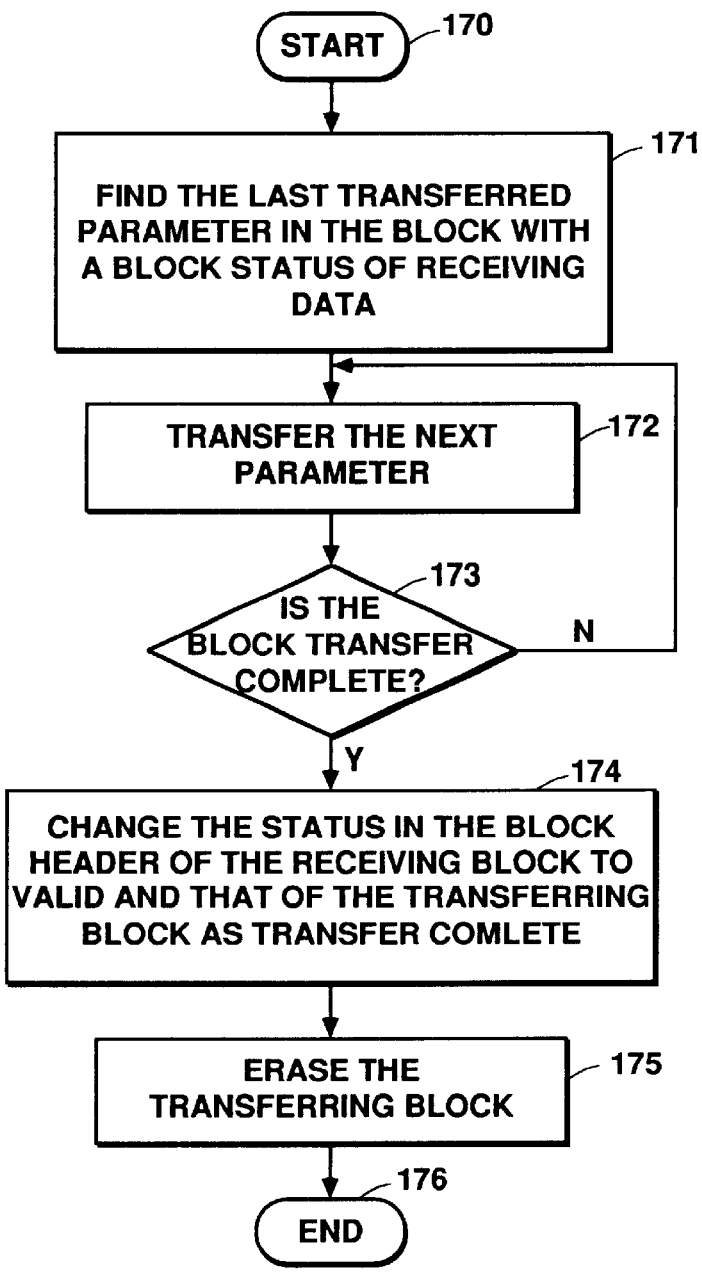

FIGS. 7A–7B and 8 show the initialization process of the updating application program when flash EPROM 10 of FIGS. 1–3C is powered on from its power off state. FIG. 8 shows different combinations of status of two parameter blocks (i.e., blocks 26 and 27) at the power up. FIG. 7A shows the initialization process and FIG. 7B shows the complete block transfer subroutine of the initialization process of FIG. 7A. As can be seen from FIG. 7A, the complete block transfer subroutine is called at steps 156 and 158.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A processor-implemented method of updating a datum stored in a memory without a prior erasure of the memory, comprising the steps of:

(A) locating a first storage location in the memory that stores a first version of the datum, wherein the memory includes memory cells each of which cannot be overwritten from a first logical state to a second logical state without the prior erasure;

(B) storing a second version of the datum in a second storage location of the memory;

(C) writing an address of the second storage location into a next location address field of the first storage location;

(D) writing to a status field of the first storage location to indicate that the first version of the datum has been superseded by the second version of the datum such that the datum is updated without the prior erasure of the memory.

2. The processor-implemented method of claim 1, further comprising the steps of (E) locating the second storage location in the memory that stores the second version of the datum when the datum needs to be further updated through the address stored in the next location address field of the first storage location, (F) storing a third version of the datum in a third storage location of the memory;

(G) writing an address of the third storage location into a next location address field of the second storage location;

(H) writing to a status field of the second storage location to indicate that the second version of the datum has been superseded by the third version of the datum such that the datum is updated without the prior erasure of the memory.

3. The processor-implemented method of claim 2, wherein the step (E) further comprises the steps of
   (i) locating an entry in a jump table that stores an address of the first storage location;
   (ii) obtaining the address of the first storage location to access the first storage location;
   (iii) determining if the next location address field of the first storage location stores an address;
   (iv) locating the second storage location with the address stored in the next location address field of the first storage location if the next location address field of the first storage location stores the address.

4. The processor-implemented method of claim 3, further comprising the steps of
   (v) determining if the next location address field of the second storage location stores the address;
   (vi) if the next location address field of the second storage location does not store any address, then performing the step (F);
   (vii) if the next location address field of the second storage location stores the address, then causing the second storage location to be the first storage location and repeating the steps (iii) through (v).

5. The processor-implemented method of claim 2, wherein the step (F) further comprising the steps of
   (I) determining if the memory has any free storage location;
   (II) if the memory is determined to have a free storage location, then locating the third storage location;
   (III) if the memory is determined not to have any free storage location, then performing a clean-up operation to transfer a most recent version of all data stored in the memory out of the memory and then erasing the memory.

6. The processor-implemented method of claim 2, wherein each of the steps (D) and (H) further comprises the step of causing each bit of the status field to be written to the first logical state.

7. A processor-implemented method of updating a datum stored in a nonvolatile semiconductor memory, bits of which cannot be overwritten from a first logical state to a second logical state without a prior erasure of the memory, comprising the steps of:
   (A) accessing a first storage location in the memory that stores a first version of the datum;
   (B) checking a status field of the first storage location to determine whether the first version of the datum has been superseded;
   (C) if the status field of the first storage location indicates that the first version of the datum has not been superseded, then
      (i) storing a most recent version of the datum in a second storage location of the memory;
      (ii) writing an address of the second storage location into a next location address field of the first storage location;
      (iii) writing to the status field of the first storage location to indicate that the first version of the datum has been superseded by the most recent version of the datum such that the datum is updated without the prior erasure of the memory;
   (D) if the status field of the first storage location indicates that the first version of the datum has been superseded, then
      (i) accessing a next location address field of the first storage location to obtain an address of a next storage location that stores a second version of the datum that supersedes the first version of the datum;
      (ii) causing the next storage location to be the first storage location and repeating the steps (A) and (B).

8. The processor-implemented method of claim 7, further comprising the step of accessing a jump table to obtain the address of the first storage location prior to the step (A).

9. The processor-implemented method of claim 7, wherein the step (C) further comprising the steps of
   (iv) determining whether the memory has any free storage location prior to the step (C)(i);
   (v) if the memory has a free storage location, then executing the step (C)(i);
   (vi) if the memory does not have any free storage location, then performing a clean-up operation to transfer a most recent version of all data stored in the memory out of the memory and then erasing the memory.

10. The processor-implemented method of claim 7, wherein the nonvolatile semiconductor memory is an electrically erasable and programmable nonvolatile memory.

11. A processor-implemented method of managing data stored in a memory that is a nonvolatile semiconductor memory, bits of which cannot be overwritten from a first logical state to a second logical state without a prior erasure, comprising the steps of:
   (A) allocating a data field in a first memory location for storing a first version of a datum;
   (B) allocating a status field in the first memory location for indicating whether the first version of the datum has been superseded by a second version of the datum;
   (C) allocating a next address field in the first memory location for storing an address of a second memory location of the memory that stores the second version of the datum if the status field of the first memory location has been written to indicate that the first version of the datum has been superseded such that the datum is updated in the memory without the prior erasure.

12. The processor-implemented method of claim 11, further comprising the step of providing a jump table in the memory that includes an entry that stores an address of the first memory location in the memory.

13. The processor-implemented method of claim 12, further comprising the steps of
   (D) allocating a data field in the second memory location for storing the second version of the datum;
   (E) allocating a status field in the second memory location for indicating whether the second version of the datum has been superseded by a third version of the datum;
   (F) allocating a next address field in the second memory location for storing the address of a third memory location of the memory that stores the third version of the datum if the status field of the second memory location has been written to indicate that the second version of the datum has been superseded such that the datum is updated in the memory without the prior erasure.

14. The processor-implemented method of claim 11, wherein the nonvolatile semiconductor memory is an electrically erasable and programmable nonvolatile memory.

15. An apparatus for storing a datum, comprising:
(A) a processor;
(B) a nonvolatile memory having a first and a second processor-allocated memory location, each including memory cells that cannot be overwritten from a first logical state to a second logical state without a prior erasure, wherein the first processor-allocated memory location further comprises
  (a) a data field that stores a version of the datum;
  (b) a status field indicating whether the version of the datum has been superseded by an updated version of the datum;
  (c) a next pointer field that stores an address of the second processor-allocated memory location that stores the updated version of the datum such that the datum is updated in the memory without the prior erasure.

16. The apparatus of claim 15, further comprises a jump table that includes an entry that stores an address of an initial processor-allocated memory location, wherein the initial processor-allocated memory location further comprises
  (i) a data field that stores an initial version of the datum;
  (ii) a status field indicating that the initial version of the datum has been superseded by the version of the datum stored in the data field of the first processor-allocated memory location;
  (iii) a next pointer field that stores the address of the first processor-allocated memory location.

17. The apparatus of claim 15, wherein the second processor-allocated memory location further comprises
  (I) a data field that stores the updated version of the datum;
  (II) a status field for indicating whether the updated version of the datum has been superseded by any further updated version of the datum;
  (III) a next pointer field for storing an address of a third processor-allocated memory location that stores the further updated version of the datum if the updated version of the datum needs to be further updated by the further updated version of the datum.

18. The apparatus of claim 15, wherein the nonvolatile memory is an electrically erasable and programmable nonvolatile memory.

\* \* \* \* \*